(12) United States Patent
Shen et al.

(10) Patent No.: US 11,789,655 B2
(45) Date of Patent: Oct. 17, 2023

(54) EFFICIENT AND LOW LATENCY MEMORY ACCESS SCHEDULING

(71) Applicant: Advanced Micro Devices, Inc., Santa Clara, CA (US)

(72) Inventors: Guanhao Shen, Austin, TX (US); Ravindra Nath Bhargava, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 121 days.

(21) Appl. No.: 17/490,684

(22) Filed: Sep. 30, 2021

(65) Prior Publication Data

US 2022/0317934 A1 Oct. 6, 2022

Related U.S. Application Data

(63) Continuation-in-part of application No. 17/218,703, filed on Mar. 31, 2021.

(51) Int. Cl.
*G06F 3/06* (2006.01)

(52) U.S. Cl.
CPC .......... *G06F 3/0659* (2013.01); *G06F 3/0611* (2013.01); *G06F 3/0619* (2013.01); *G06F 3/0673* (2013.01)

(58) Field of Classification Search
CPC .... G06F 3/0611; G06F 3/0619; G06F 3/0659; G06F 3/0673; G06F 13/161; G06F 13/1626; G06F 13/1642; G06F 13/18; G11C 11/409

See application file for complete search history.

(56) References Cited

U.S. PATENT DOCUMENTS

| | | | |
|---|---|---|---|
| 9,489,321 B2 | 11/2016 | O'Connor et al. | |
| 10,402,120 B2 | 9/2019 | Balakrishnan | |
| 2003/0070055 A1* | 4/2003 | Johnson | G06F 13/1642 711/158 |
| 2003/0188107 A1* | 10/2003 | Hill | G06F 12/0862 712/E9.047 |
| 2006/0112240 A1 | 5/2006 | Walker et al. | |

(Continued)

OTHER PUBLICATIONS

International Search Report and Written Opinion for International Application No. PCT/US2022/021149, dated Jun. 17, 2022, 8 pages.

*Primary Examiner* — Larry T Mackall
(74) *Attorney, Agent, or Firm* — Polansky & Associates, P.L.L.C.; Paul J. Polansky

(57) ABSTRACT

A memory controller includes a command queue that receives and stores decoded memory commands and information related thereto including information indicating a type, a priority, an age, and a region of a memory system for a corresponding decoded memory command, and an arbiter coupled to the command queue and picks selected decoded memory commands among the decoded memory commands from the command queue for dispatch to the memory system by comparing the priority and the age for decoded memory commands having a first type. The arbiter detects when the command queue receives a decoded memory command of a second type opposite to said first type that accesses a first memory region of the memory system, and in response performs at least one pre-work action that reduces a latency of the decoded memory command of the second type.

17 Claims, 6 Drawing Sheets

(56) References Cited

U.S. PATENT DOCUMENTS

| | | |
|---|---|---|
| 2011/0179240 A1 | 7/2011 | Sukonik et al. |
| 2011/0276974 A1 | 11/2011 | Chung et al. |
| 2018/0165229 A1 | 6/2018 | Chhabra et al. |
| 2019/0121545 A1 | 4/2019 | La Fratta et al. |

* cited by examiner

EFFICIENT AND LOW LATENCY MEMORY ACCESS SCHEDULING

This application is a continuation-in-part of application Ser. No. 17/218,703, filed Mar. 31, 2021, invented by the inventors hereof and assigned to the assignee hereof.

BACKGROUND

Computer systems typically use inexpensive and high density dynamic random-access memory (DRAM) chips for main memory. Most DRAM chips sold today are compatible with various double data rate (DDR) DRAM standards promulgated by the Joint Electron Devices Engineering Council (JEDEC). DDR DRAMs use conventional DRAM memory cell arrays with high-speed access circuits to achieve high transfer rates and to improve the utilization of the memory bus.

A typical DDR memory controller maintains a queue to store pending read and write requests to allow the memory controller to pick the pending requests out of order and thereby to increase efficiency. For example, the memory controller can retrieve multiple memory access requests to the same row in a given rank of memory (referred to as "page hits") from the queue out of order and issue them consecutively to the memory system to avoid the overhead of precharging the current row and activating another row repeatedly.

DRAM memory controllers also typically try to prioritize read accesses before write accesses to avoid stalling a data processor while instructions or necessary data as fetched from relatively slow main memory. However, DDR memory requires overhead to "turn-around" the memory bus from processing write accesses to processing read accesses. The loss in efficiency by turning around the bus from writes to reads has made it difficult to provide low latency for read accesses while preserving memory controller efficiency.

Figure 1:
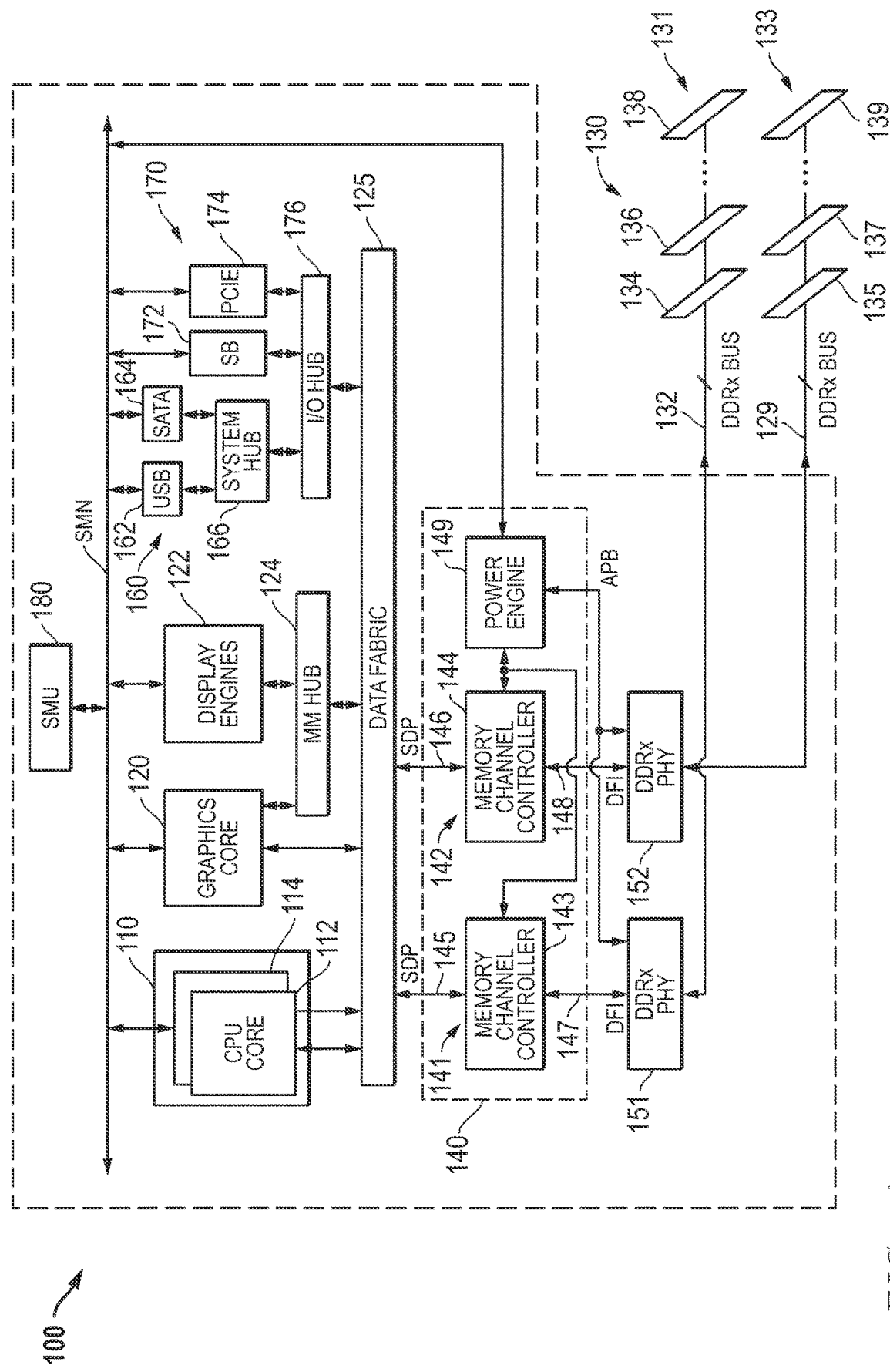
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a command queue and an arbiter. The command queue is for receiving and storing decoded memory commands and information related thereto including information indicating a type, a priority, an age, and a region of a memory system for a corresponding decoded memory command. The arbiter is coupled to the command queue for picking selected decoded memory commands among the decoded memory commands from the command queue for dispatch to the memory system by comparing the priority and the age for decoded memory commands having a first type. The arbiter detects when the command queue receives a decoded memory command of a second type opposite to the first type that accesses a first memory region of the memory system, and in response performs at least one pre-work action that reduces a latency of the decoded memory command of the second type.

A data processing system includes a memory accessing agent for providing memory access requests, a memory system, and a memory controller. The memory controller includes a command queue and an arbiter. The command queue is for receiving and storing decoded memory commands and information related thereto including information indicating a type, a priority, an age, and a region of a memory system for a corresponding decoded memory command. The arbiter is coupled to the command queue for picking selected decoded memory commands among the decoded memory commands from the command queue for dispatch to the memory system by comparing the priority and the age for decoded memory commands having a first type. The arbiter detects when the command queue receives a decoded memory command of a second type opposite to the first type that accesses a first memory region of the memory system, and in response performs at least one pre-work action that reduces a latency of the decoded memory command of the second type.

A method includes receiving a plurality of decoded memory commands for a memory system, storing the plurality of decoded memory commands in a command queue in response to the receiving, arbitrating among the decoded memory commands in the command queue to pick a selected decoded memory command among the decoded memory commands based on a priority and an age of the decoded memory commands, detecting when the command queue receives a decoded memory command of a second type that accesses a first memory region of the memory system. In response to detecting a presence of the decoded memory command of the second type that accesses the first memory region of the memory system, at least one pre-work action that reduces a latency of the decoded memory command of the second type is performed.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 140, a data fabric 125, a set of peripheral controllers 160, a set of peripheral bus controllers 170, and a system management unit (SMU) 180. As will be appreciated by a person of ordinary skill APU 100 may not have all of these elements present in every embodiment and, further, may have additional elements included therein. Furthermore, APU 100 may comprise one or multiple integrated circuits in, for example, a system.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection to memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120.

If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
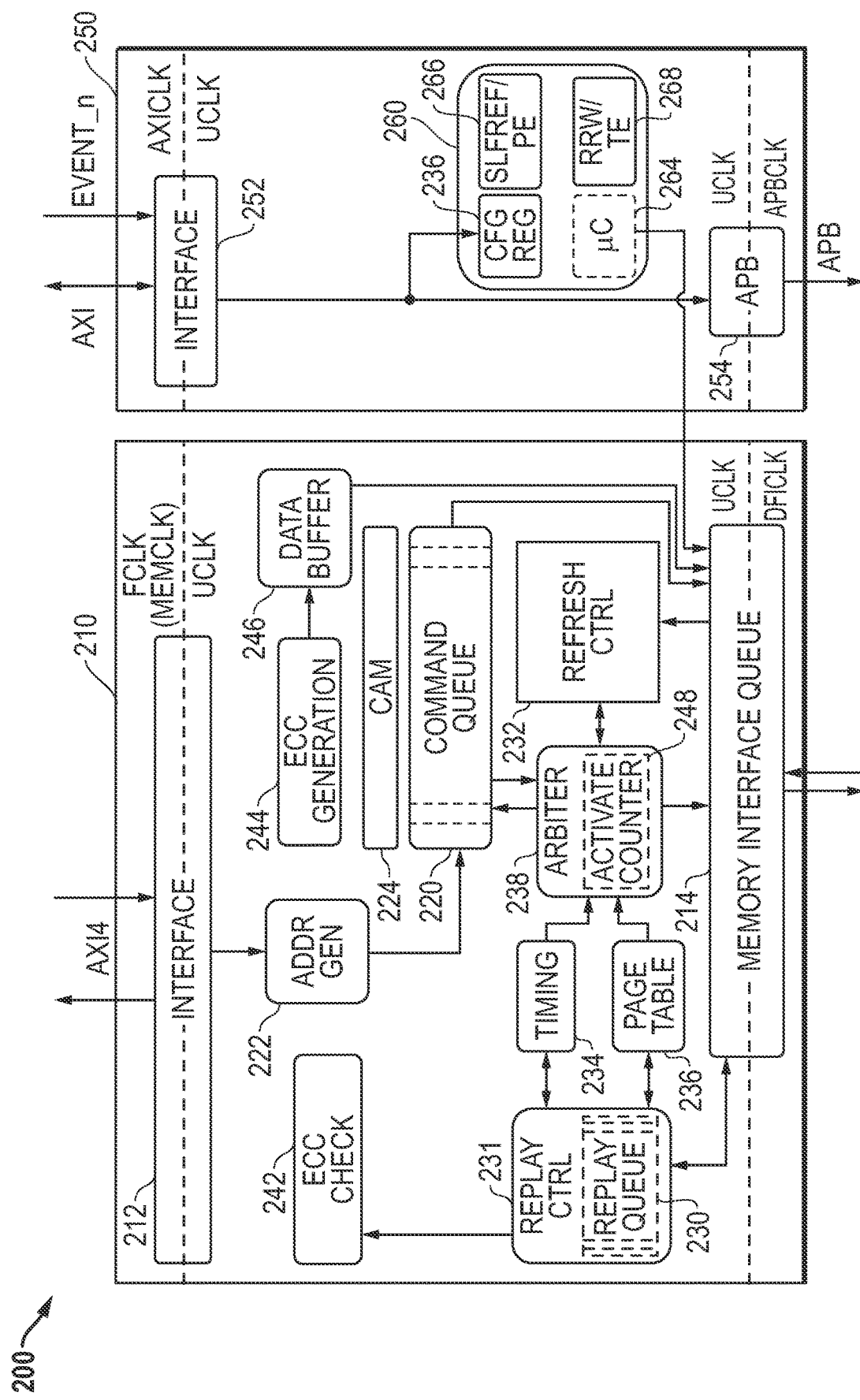
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, a refresh logic block 232, a timing block 234, a page table 236, an arbiter 238, an error correction code (ECC) check circuit 242, an ECC generation block 244, and a data buffer 246.

Interface 212 has a first bidirectional connection to data fabric 125 over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the memory. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a recovery sequence in which accesses are replayed in the case of a parity or ECC error of one of these cycles. Replayed commands are placed in the memory interface queue 214.

Refresh control logic 232 includes state machines for various power down, refresh, and termination resistance (ZQ) calibration cycles that are generated separately from normal read and write memory access requests received from memory accessing agents. For example, if a memory rank is in precharge power down, it must be periodically awakened to run refresh cycles. Refresh control logic 232 generates refresh commands periodically and in response to designated conditions to prevent data errors caused by leaking of charge off storage capacitors of memory cells in DRAM chips. The memory regions are memory banks in some embodiments, and memory sub-banks in other embodiments as further discussed below. Refresh control logic 232 also generates refresh commands, which include both refresh (REF) commands and refresh management (RFM) commands, in which the RFM commands direct the memory to perform refresh functions for mitigating row hammer issues as further described below. In addition, refresh control logic 232 periodically calibrates ZQ to prevent mismatch in on-die termination resistance due to thermal changes in the system.

Arbiter 238 is bidirectionally connected to command queue 220 and is the heart of memory channel controller 210. Arbiter 238 improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230. Arbiter 238 includes an activate counter 248, which in this embodiment includes a counter for each memory region which counts a number of activate commands sent over the memory channel to a memory region. Arbiter 238 is bidirectionally connected to refresh control logic 232 to monitor refresh commands and direct refresh activities.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface, version one (AXI), an advanced peripheral bus (APB) interface 254, and a power engine 260. Interface 252 has a first bidirectional connection to the SMN, which includes an input for receiving an event signal labeled "EVENT n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (μC) 264, a self refresh controller (SLFREF/PE) 266, and a reliable read/write timing engine (RRW/TE) 268.

Configuration registers 262 are programmed over the AXI bus, and store configuration information to control the operation of various blocks in memory controller 200. Accordingly, configuration registers 262 have outputs connected to these blocks that are not shown in detail in FIG. 2. Self refresh controller 266 is an engine that allows the manual generation of refreshes in addition to the automatic generation of refreshes by refresh control logic 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Figure 3:
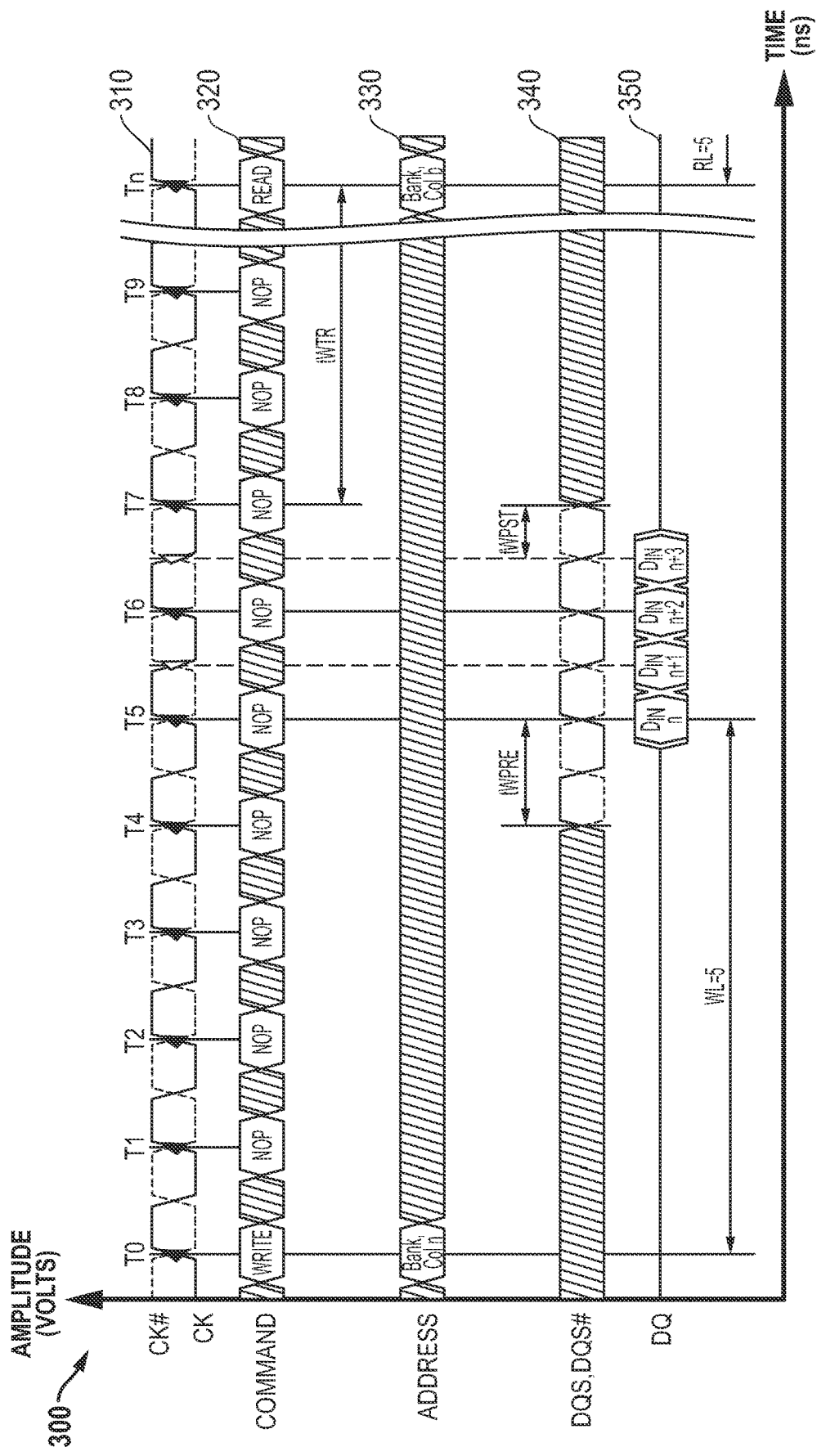
FIG. 3 illustrates a timing diagram of a write-to-read turnaround in a DDR SDRAM.

FIG. 3 illustrates a timing diagram 300 of a write-to-read turnaround in a DDR SDRAM. In timing diagram 300, the horizontal axis represents time in nanoseconds (ns), and the vertical axis represents the amplitude of various signals of interest in volts. Timing diagram 300 illustrates several waveforms of interest, including a waveform 310 showing a clock signal pair, a waveform 320 showing a memory command, a waveform 330 showing an address, a waveform 340 showing a data strobe pair, and a waveform 350 showing a data bus.

Waveform 310 shows a clock signal pair including a true clock signal labelled "CK", and a complement clock signal labelled "CK #". Transfers on the command, address, and data bus are centered around the transition points of the CK and CK # signals. In timing diagram 300, each transition indicates a time point, labelled "T0", "T1", and so on through "T9". A subsequent time point labelled "Tn" occurs at a time determined by a timing parameter of the DDR SDRAM as will be explained further below.

Waveform 320 shows a sequence of commands labelled "COMMAND". These commands are indicated by certain states of DRAM control signals and correspond to the commands listed in the corresponding DDR SDRAM command truth table. Three commands are illustrated in FIG. 3: a write command labelled "WRITE" at T0; nine no-operation command labelled "NOP" at times T1 through T9; and a read command labelled "READ" at Tn.

Waveform 330 shows addresses that indicate a selected bank and a selected column of the active row in the bank. For example, at time T0, the ADDRESS indicates a bank labelled "Bank" and a column labelled "Col n". At time Tn, the ADDRESS indicates the same bank but a different column labelled "Col b". At all other times in timing diagram 300, the memory controller does not provide an address and the memory PHY does not drive an address on the memory bus.

Waveform 340 shows a data strobe signal pair including a true data strobe signal labelled "DQS" and a complementary data strobe signal labelled "DQS #". The data strobe signal pair is used to latch valid data signals on the data bus. During a write cycle, DQS and DQS # are driven by the memory controller and are used by the memory to latch the data. During a write preamble period defined by the timing parameter tWPRE, DQS is initially driven high followed by low, and the first data element is transferred with appropriate setup and hold time around the rising edge of DQS and the falling edge of DQS #. Subsequent transfers take place on the next three transitions of DQS and DQS #. At the end of the last transfer, the DQS signal is driven low for a half-clock period and DQS # is driven high for a half clock period before the memory controller stops driving both signals.

Waveform 350 shows the data that is transferred during a write cycle in a burst of four on four consecutive half-clock cycles according to the double data rate technique. The time from the receipt of the write command by the memory until the start of the transfer of data is defined by the parameter tWL, which is this example is five clock periods.

Timing diagram 300 shows that the minimum time from the issuance of a read cycle following a write cycle is WL+burst length+tWTR, or in this example 9 clock periods plus tWTR. In some memories with high clock speeds, tWTR can be a relatively large number of clock cycles. For example, in DDR5 running at 3200 MHz, tWTR can be 24 clock cycles for a write followed by a read to the same bank group. Thus, even a high-priority read that will slow the operation of the CPU if not issued quickly will be delayed by a future timing dependency caused by a write cycle.

In order to reduce read latency, the inventors have developed a mechanism known as dynamic latency aware write (DLAW) picking to reduce average read latency. The memory controller implements DLAW picking by elevating the priority of older write accesses stored in the command queue in response to detecting the presence of a read command to the same memory region. In this way, an older write command will be issued sooner than it would otherwise have been, allowing the read cycle to the same region of memory to be eligible for issuance earlier following the issuance of an older write. If no newer reads to the same region are detected, the write commands will be issued using the existing arbitration rules, thereby maintaining efficiency established by other existing command arbitration rules.

By recognizing the possibility of future write-to-read dependencies and adjusting the command arbitration process to reduce the impact, memory controller 200 improves average read latency. The command arbitration is adjusted in a manner consistent with existing command queue fields and existing command arbitration mechanisms, allowing it to integrate easily with existing memory controller architectures and preserve efficiency while avoiding the need for a significant re-design.

Figure 4:
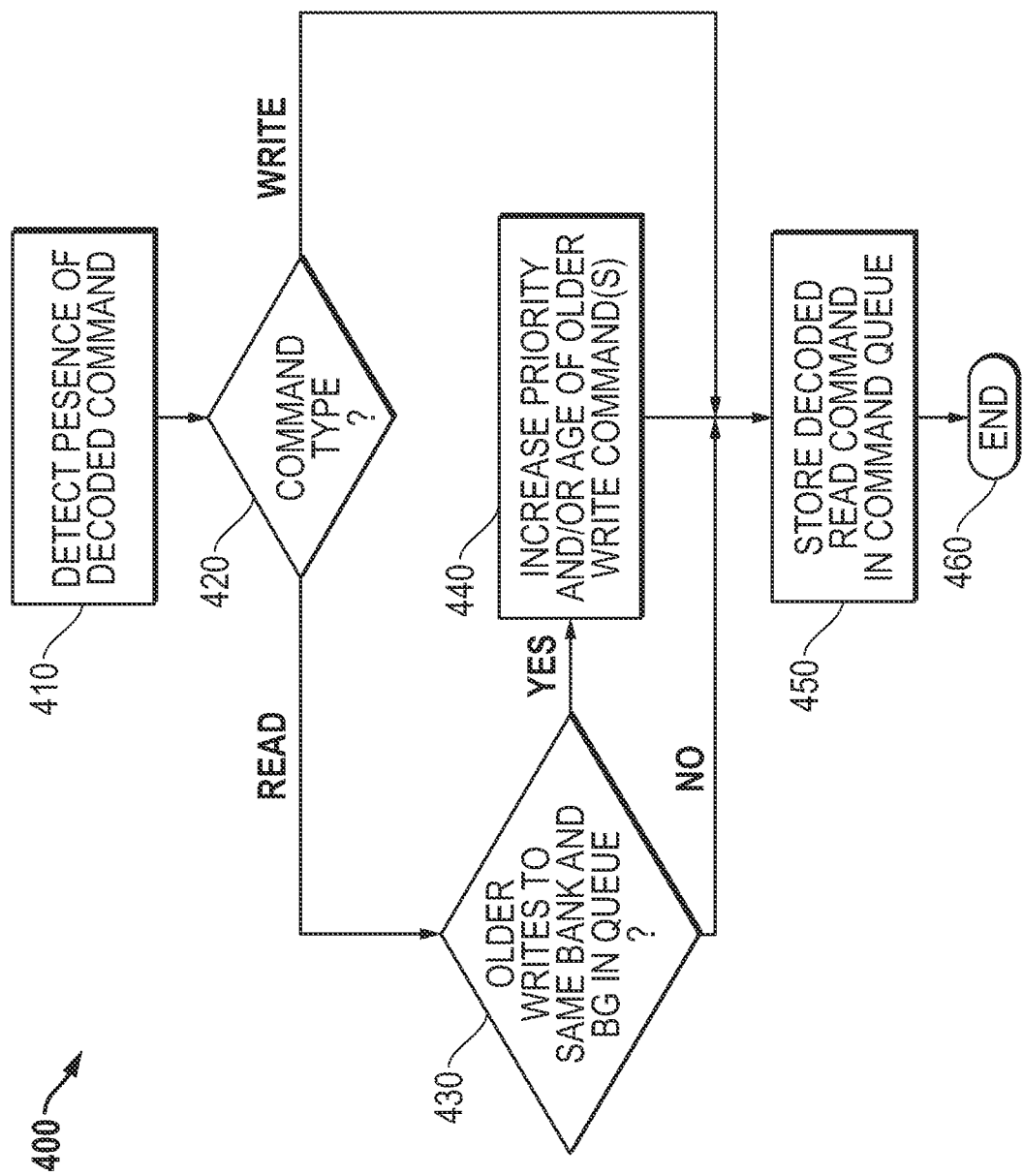
FIG. 4 is a flow diagram of a process for dynamic latency aware write (DLAW) picking in a memory controller according to some embodiments.

FIG. 4 is a flow diagram of a process 400 for dynamic latency aware write (DLAW) picking in a memory controller according to some embodiments. Process 400 begins at action box 410 by detecting the presence of a decoded command at an input of command queue 220. The presence could be detected by receiving a new command or otherwise, such as be determining timing eligibility. At decision box 420, the command type is determined as a read command or a write command. If the command is a read command, then flow proceeds to decision box 430. At decision box 430, process 400 determines whether there is an older write or writes to the same rank and bank in command queue 220 as the decoded read command. If so, then at action box 440, the process increases the priority and/or age of the older write commands stored in command queue 220. Flow then proceeds to action box 450. If not, then flow proceeds directly to action box 450. If on the other hand, a write command is detected at decision box 420, then flow proceeds directly to action box 450. In action box 450, process 400 stores the decoded read command in command queue 220 without affecting the priority and/or age of any other command. Process 400 ends at action box 460.

Figure 5:
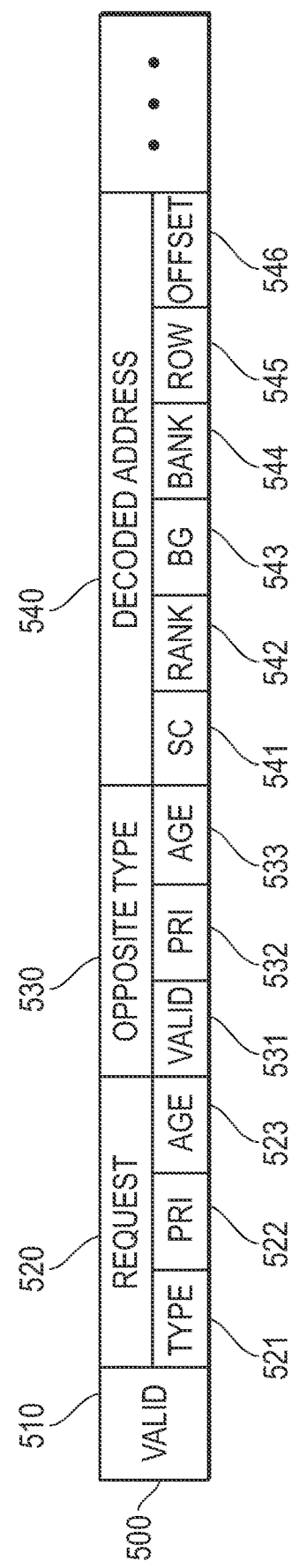
FIG. 5 illustrates an entry of the command queue of the memory controller of FIG. 2 according to some embodiments.

FIG. 5 illustrates an entry 500 of the command queue of the memory controller of FIG. 2 according to some embodiments. Entry 500 includes generally a valid field 510, a request field 520, an opposite type field 530, a decoded address field 540, and additional fields not relevant to the present disclosure and not specifically shown in FIG. 5.

Valid field 510 indicates whether the entry is valid. In some embodiments, command queue 220 stores each entry in age order such that the position in command queue implicitly indicates relative age, in which the bottom of the queue is indicated by the last valid entry. If arbiter 238 picks an entry out of order leaving a hole in the valid entries, in which the hole indicates an invalid entry in the region of valid entries, then the command queue 220 shifts younger entries to fill the hole such that command queue 220 again stores a contiguous set of valid commands in relative age order.

Request field 520 includes information about the decoded memory command stored in entry 500. Request field 520 includes a type sub-field 521, a priority sub-field 522, and an age sub-field 523. Type sub-field 521 indicates whether the decoded memory command is a read access or a write access. Priority sub-field 522 indicates a priority for the access to allow arbiter 238 to pick a winner among other commands stored in command queue 220 during an arbitration cycle. The priority stored in priority sub-field 522 can correspond to an explicit priority such as a predetermined quality of service (QoS), or an adjusted priority that arbiter 238 adjusts to allow the corresponding memory access command to make progress and eventually be picked such as by the rules for DLAW picking disclosed herein. Age sub-field 523 indicates the relative age in command queue 220, or an adjusted age that arbiter 238 adjusts to allow the corresponding memory access command to make progress and eventually be picked such as by the rules for DLAW picking disclosed herein.

Opposite type field 530 includes information about one or more valid entries in command queue 220 having the opposite type as the type stored in TYPE sub-field 521. Opposite type field 530 includes a valid sub-field 531, a priority sub-field 532, and an age sub-field 533. Valid sub-field 531 indicates whether command queue 220 currently stores any valid decoded memory access commands of the opposite type to the same region as the region of memory of entry 500. The selected region is indicated by decoded address field 540 as described below. Priority sub-field 532 indicates the priority for the opposite type entry or entries in command queue 220. Age sub-field 533 indicates the relative age for the opposite type entry or entries in command queue 220.

Decoded address field 540 stores information identifying the location in memory system 130 of the corresponding memory access. It includes any mapping or transformation (such as scrambling or swizzling of memory addresses) performed on the physical address received by address generator 222 based on the size and organization of memory system 130. It includes a sub-channel sub-field 541, a rank sub-field 542, a bank-group sub-field 543, a bank sub-field 544, a row sub-field 544, and an offset sub-field 546. Sub-channel sub-field 541 indicates a sub-channel for memory controllers that support a mode known as virtual controller mode. In virtual controller mode, a single memory controller can efficiently support separate memory channels using the same memory controller hardware, and demultiplexing the decoded memory accesses onto two physical channels known as "sub-channels" using the sub-channel value stored in sub-channel sub-field 541. Rank sub-field 542 stores information about the rank selected on the selected memory channel. Bank-group sub-field 543 indicates which bank group the access stored in entry 500 is associated with. Certain DDR SDRAMs, such as DDR4 and DDR5 SDRAMs, share decoding circuitry among adjacent banks, simplifying the design of the memory but requiring coordination because of timing constraints between accesses to different banks in the same bank group. Bank sub-field 544 indicates the bank of the access, which determines whether an access will be a "page hit" or "page conflict" based on the currently open page in a given bank. The OFFSET sub-field contains the offset address within the corresponding page.

In an alternate embodiment, memory controller 200 could use a command queue that includes both a conventional command queue storing information about memory access requests, as well as a circuit separate from the conventional command queue to store information about opposite-type accesses. In this embodiment, the separate circuit would a stand-alone page table that would keep track of the information related to opposite-type accesses. The page table would be bank-addressable, in which each entry would store information indicating the existence of a read request to the corresponding bank, the existence of a write request to the corresponding bank, the oldest age and priority of all read requests to this bank, and the oldest age and priority of all write requests to this bank. Arbiter 238 would check both the conventional command queue along with this standalone page table to schedule requests. This alternate embodiment has the advantage of simplifying the design by avoiding the need to re-design the command queue.

Figure 6:
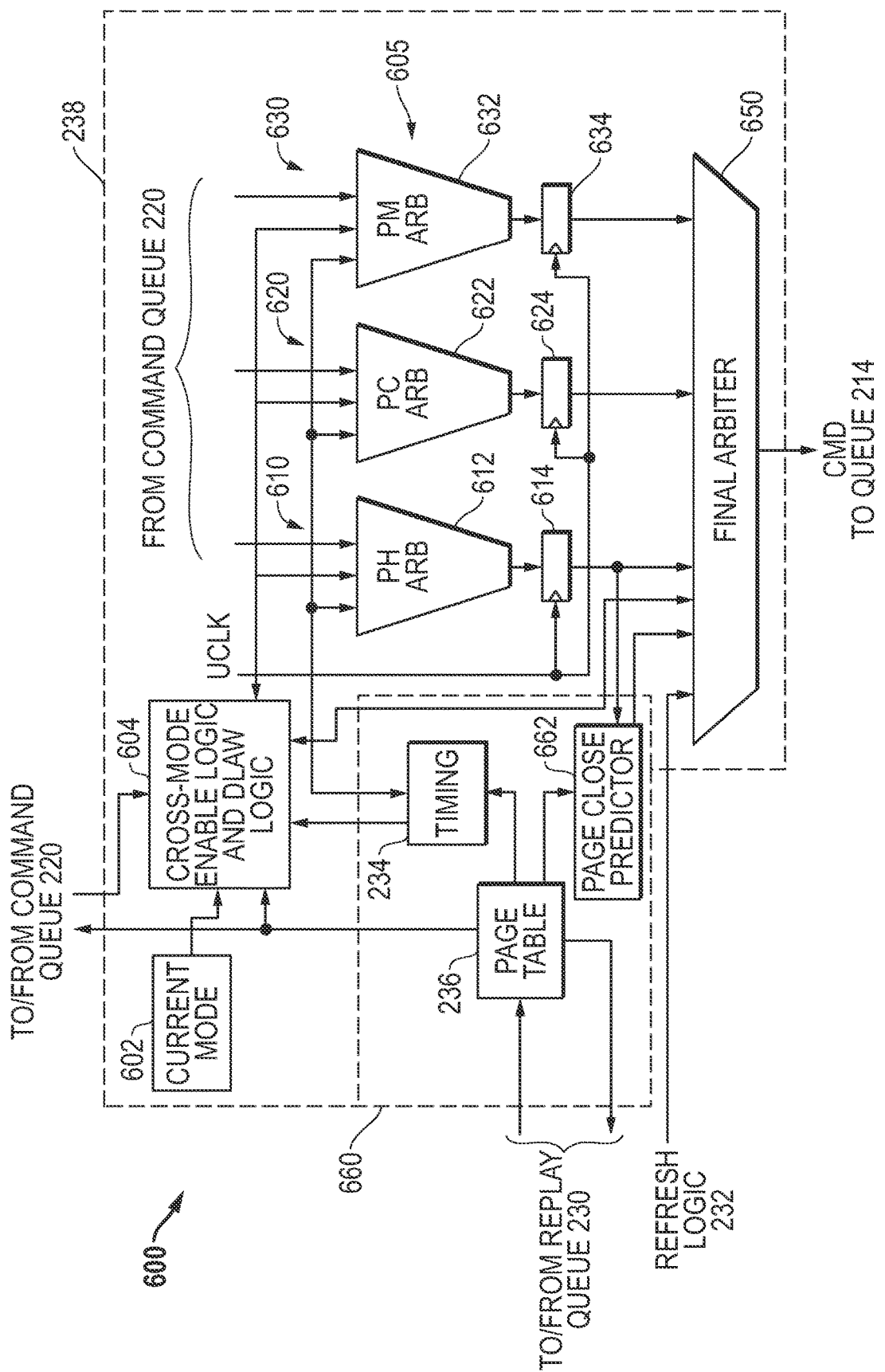
FIG. 6 illustrates a block diagram of a portion of a memory controller that is useful for implementing the DLAW picking technique of FIG. 4 according to some embodiments.

FIG. 6 illustrates a block diagram of a portion 600 of memory controller 200 of FIG. 2 that is useful for implementing the DLAW picking technique of FIG. 4 according to some embodiments. Portion 600 includes arbiter 238 and a set of control circuits 660 associated with the operation of arbiter 238.

Arbiter 238 includes a set of sub-arbiters 605 and a final arbiter 650. Sub-arbiters 605 include a sub-arbiter 610, a sub-arbiter 620, and a sub-arbiter 630. Sub-arbiter 610 includes a page hit arbiter 612 labeled "PH ARB", and an output register 614. Page hit arbiter 612 has a first input connected to command queue 220, a second input, and an output. Register 614 has a data input connected to the output of page hit arbiter 612, a clock input for receiving the UCLK signal, and an output. Sub-arbiter 620 includes a page conflict arbiter 622 labeled "PC ARB", and an output register 624. Page conflict arbiter 622 has a first input connected to command queue 220, a second input, and an output. Register 624 has a data input connected to the output of page conflict arbiter 622, a clock input for receiving the UCLK signal, and an output. Sub-arbiter 630 includes a page miss arbiter 632 labeled "PM ARB", and an output register 634. Page miss arbiter 632 has a first input connected to command queue 220, a second input, and an output. Register 634 has a data input connected to the output of page miss arbiter 632, a clock input for receiving the UCLK signal, and an output. Final arbiter 650 has a first input connected to the output of refresh control logic 232, a second input from a page close predictor 662, a third input connected to the output of output register 614, a fourth input connected to the output of output register 624, a fifth input connected to the output of output register 634, and an output for providing an arbitration winner labelled "CMD" to memory interface queue 214. In some embodiments, final arbiter 650 is able to pick two sub-arbitration winners per memory controller clock cycle.

Control circuits 660 include timing block 234 and page table 236 as previously described with respect to FIG. 2, and a page close predictor 662, a current mode register 602, and cross-mode enable logic 604. Timing block 234 has an output connected to cross-mode enable logic 604, an input and an output connected to page hit arbiter 312, page conflict arbiter 322, and page miss arbiter 332. Page table 234 has an input connected to an output of replay queue 230, an output connected to an input of replay queue 230, an output connected to the input of command queue 220, an output connected to the input of timing block 234, and an output connected to the input of page close predictor 662. Page close predictor 662 has an input connected to one output of page table 236, an input connected to the output of output register 614, and an output connected to the second input of final arbiter 650. Cross-mode enable logic 604 has an input connected to current mode register 602, and input connected to command queue 220, an input and output connected to final arbiter 650, and an input and output connected to page hit arbiter 610, page conflict arbiter 620, and page miss arbiter 630.

In operation, arbiter 238 selects memory access commands from command queue 220 and refresh control logic 232 by taking into account the current mode (indicating whether a read streak or write streak is in progress), the page status of each entry, the priority of each memory access request, and the dependencies between requests. The priority is related to the quality of service or QoS of requests received from the AXI4 bus and stored in command queue 220, but can be altered based on the type of memory access and the dynamic operation of arbiter 238. Arbiter 238 includes three sub-arbiters that operate in parallel to address the mismatch between the processing and transmission limits of existing integrated circuit technology. The winners of the respective sub-arbitrations are presented to final arbiter 650. Final arbiter 650 selects between these three sub-arbitration winners as well as a refresh operation from refresh control logic 232, and may further modify a read or write command into a read or write with auto-precharge command as determined by page close predictor 662.

Cross-mode enable and DLAW logic 604 operates to cause and manage streaks of read commands and streaks of write commands over the memory channel. During a current streak of either type of commands, cross-mode enable and DLAW logic 604 monitors an indicator of data bus efficiency of the memory channel. In response to the indicator of data bus efficiency indicating that data bus efficiency is less than a designated threshold, cross-mode enable and DLAW logic 304 stops the current streak, starts a streak of the other type, and changes the current mode in current mode register 602.

Each of page hit arbiter 612, page conflict arbiter 622, and page miss arbiter 632 has an input connected to the output of timing block 234 to determine timing eligibility of commands in command queue 220 that fall into these respective categories. Timing block 234 includes an array of binary counters that count durations related to the particular operations for each bank in each rank. The number of timers needed to determine the status depends on the timing parameter, the number of banks for the given memory type, and the number of ranks supported by the system on a given memory channel. The number of timing parameters that are implemented in turn depends on the type of memory implemented in the system. For example, GDDR5 memories require more timers to comply with more timing parameters than other DDRx memory types. By including an array of generic timers implemented as binary counters, timing block 234 can be scaled and reused for different memory types. The inputs from cross-mode enable and DLAW logic 604 signal the sub-arbiters which type of commands, read or write, to provide as candidates for final arbiter 650.

A page hit is a read or write cycle to an open page. Page hit arbiter 612 arbitrates between accesses in command queue 220 to open pages. The timing eligibility parameters tracked by timers in timing block 234 and checked by page hit arbiter 612 include, for example, row address strobe (RAS) to column address strobe (CAS) delay time ($t_{RCD}$) and CAS latency ($t_{CL}$). For example, $t_{RCD}$ specifies the minimum amount of time that must elapse before a read or write access to a page after it has been opened in a RAS cycle. Page hit arbiter 612 selects a sub-arbitration winner based on the assigned priority of the accesses. In one embodiment, the priority is a 4-bit, one-hot value that therefore indicates a priority among four values, however it should be apparent that this four-level priority scheme is just one example. If page hit arbiter 612 detects two or more requests at the same priority level, then the oldest entry wins.

A page conflict is an access to one row in a bank when another row in the bank is currently activated. Page conflict arbiter 622 arbitrates between accesses in command queue 220 to pages that conflict with the page that is currently open in the corresponding bank and rank. Page conflict arbiter 622 selects a sub-arbitration winner that causes the issuance of a precharge command. The timing eligibility parameters tracked by timers in timing block 234 and checked by page conflict arbiter 622 include, for example, active to precharge command period ($t_{RAS}$). Page conflict arbiter 622 selects a sub-arbitration winner based on the assigned priority of the access. If page conflict arbiter 622 detects two or more requests at the same priority level, then the oldest entry wins.

A page miss is an access to a bank that is in the precharged state. Page miss arbiter 632 arbitrates between accesses in command queue 220 to precharged memory banks. The timing eligibility parameters tracked by timers in timing block 234 and checked by page miss arbiter 632 include, for example, precharge command period ($t_{RP}$). If there are two or more requests that are page misses at the same priority level, then the oldest entry wins.

Each sub-arbiter outputs a priority value for their respective sub-arbitration winner. Final arbiter 650 compares the priority values of the sub-arbitration winners from each of page hit arbiter 612, page conflict arbiter 622, and page miss arbiter 632. Final arbiter 650 determines the relative priority among the sub-arbitration winners by performing a set of relative priority comparisons taking into account two sub-arbitration winners at a time. The sub-arbiters may include a set of logic for arbitrating commands for each mode, read and write, so that when the current mode changes, a set of available candidate commands are quickly available as sub-arbitration winners.

After determining the relative priority among the three sub-arbitration winners, final arbiter 650 then determines whether the sub-arbitration winners conflict (i.e., whether they are directed to the same bank and rank). When there are no such conflicts, then final arbiter 650 selects up to two sub-arbitration winners with the highest priorities. When there are conflicts, then final arbiter 650 complies with the following rules. When the priority value of the sub-arbitration winner of page hit arbiter 612 is higher than that of page conflict arbiter 622, and they are both to the same bank and rank, then final arbiter 650 selects the access indicated by page hit arbiter 612. When the priority value of the sub-arbitration winner of page conflict arbiter 622 is higher than that of page hit arbiter 612, and they are both to the same bank and rank, final arbiter 650 selects the winner based on several additional factors. In some cases, page close predictor 662 causes the page to close at the end of the access indicated by page hit arbiter 612 by setting the auto precharge attribute.

Within page hit arbiter 612, priority is initially set by the request priority from the memory accessing agent but is adjusted dynamically based on the type of accesses (read or write) and the sequence of accesses. In general, page hit arbiter 612 assigns a higher implicit priority to reads, but implements a priority elevation mechanism to ensure that writes make progress toward completion.

Whenever page hit arbiter 612 selects a read or write command, page close predictor 662 determines whether to send the command with the auto-precharge (AP) attribute or not. During a read or write cycle, the auto-precharge attribute is set with a predefined address bit and the auto-precharge attribute causes the DDR device to close the page after the read or write cycle is complete, which avoids the need for the memory controller to later send a separate precharge command for that bank. Page close predictor 662 takes into account other requests already present in command queue 220 that access the same bank as the selected command. If page close predictor 662 converts a memory access into an AP command, the next access to that page will be a page miss.

By using different sub-arbiters for different memory access types, each arbiter can be implemented with simpler logic than if it were required to arbitrate between all access types (page hits, page misses, and page conflicts; although embodiments including a single arbiter are envisioned). Thus the arbitration logic can be simplified and the size of arbiter 238 can be kept relatively small.

In other embodiments, arbiter 238 could include a different number of sub-arbiters. In yet other embodiments, arbiter 238 could include two or more sub-arbiters of a particular type. For example, arbiter 238 could include two or more page hit arbiters, two or more page conflict arbiters, and/or two or more page miss arbiters.

Cross-mode enable and DLAW logic 604 also includes logic to elevate the priority and age of a pending write request in command queue 220 in response to detecting the presence in command queue 220 of a read to the same region of the memory system. In the illustrated example, the same region is the same virtual channel, rank, and bank. In other examples, the same region could also be the same virtual channel, rank, and bank group, especially because the tWTR parameter is significantly larger than the tWTR parameter of a different bank ground in DDR4 and DDR5 SDRAMs.

Consider the case in which a write command to a given bank is pending in command queue 220. In response to detecting the presence of a decoded read command to the same bank, arbiter 238 elevates at least one of the priority and the age of the decoded write command to the same bank already stored in command queue 220.

In a particular example, cross-mode enable and DLAW logic 304 performs the priority and age elevation in two stages. In the first stage, for each write request, cross-mode enable and DLAW logic 304 populates information for same-bank read(s) in the entry of command queue 220 for the decoded write command. Cross-mode enable and DLAW logic 304 populates the information differently depending on whether there is only one or more than one same-bank read request. If there is only one same-bank read request, cross-mode enable and DLAW logic 304 stores the same-bank read priority and age fields into sub-fields 532 and 533, respectively, of the entry of command queue 220 for the decoded write command. If there is more than one same-bank read request, cross-mode enable and DLAW logic 304 stores the same-bank read priority and age fields of the highest priority same-bank read into sub-fields 532 and 533, respectively, of the entry of command queue 220 for the decoded write command.

In the second stage, arbiter 238 performs write arbitration based on the information in command queue 220. For a write without any same-bank read, arbiter 238 compares the write command's own priority and age to the priority and age of other pending writes in command queue 220. For a write command having one or more same-bank reads, however, it calculates a new priority and a new age, and compares the new priority and new age to the priority and age of other pending writes in command queue 220.

The way in which the new priority and new age can be formed can vary based on the needs of the system. For example, for a central processing unit (CPU) of a server-based product, writes are not as important as reads. According to one technique, the mere existence of a same-bank read is significant, and the arbiter can forego populating the priority and age of the same-bank reads to save hardware complexity. According to this technique, arbiter 238 will pick a write having a same-bank read over another write without a same-bank read. If each of two writes have same-bank reads, the write with the higher priority wins. If the two writes have the same priority, the older write wins. For two writes without same-bank reads, arbiter 238 picks the write with the higher priority, but if the two writes have the same priority, the older write wins.

According to another technique, the read priority and age can be factored in to further save higher priority ready latency while requiring mode hardware complexity by populating the read information into the opposite type field 530 of the write entry. In this case, cross-mode enable and DLAW logic 604 can define the new priority to be the same as the same-bank read priority, and the new age can be the same as the same-bank read age. According to this technique, for two writes each without a same-bank read, the higher priority write wins, but if both writes have the same priority, the older write wins. A write with a same-bank read wins over a write without a same-bank read. For two writes each having one or more same-bank reads, the one with the higher new priority wins. However, if the two writes each have same-bank reads and have the same new priority, then the one with the older new age wins.

According to yet another technique, the new priority and new age can be defined in such a way as to simplify the picking algorithm. In this case, the new priority is a function of both the write priority and the same-bank read priority, such as by splicing a read priority vector and a write priority vector. The new age can be defined as a function of the write age and the same-bank read age as follows. If there is a same-bank read, then the new age is equal to the same-bank read. In this case, the arbitration algorithm between two writes can be simplified to picking the write with the higher new priority, of if the two writes have the same new priority, then pick the write with the older new age.

Another use case is a more highly integrated processor for a desktop or a notebook computer, such as an APU with an integrated graphics controller and a unified memory architecture. For these cases, write latency is also important and there are at least two techniques for forming new priority and new age values for use in arbitration. In one example, the priority and age can be biased toward high priority writes so that if the write is high priority, then the new priority is high, or else use the same-bank read priority, and if the write is high priority, then the new age is the write age, or else the write priority is the same-bank read priority.

Any of the previously-described techniques can be used for page hit writes, page miss writes, and/or page conflict writes, in which the arbiter performs a pre-work action that reduces a latency of the cross-mode access. Moreover, while the technique was described in terms of write commands in the presence of same-bank read commands to bias the write commands to help lower the latency of the read comments, the opposite condition is also possible.

Early Page Hit Write Burst Termination

So far, various techniques have been described related to reducing the read latency by prioritizing writes which the reads depend on to better hide same-bank write-to-read latency. Otherwise, if those writes are picked late, then the same-bank write-to-read latency may not be hidden in the write burst, and the reads need to continue to wait to satisfy the same-bank write-to-read latency rather than being picked immediately. For example, arbiter 238 can elevate the priority and/or age fields of existing commands of a first type in the command queue, e.g., writes, after the receipt of commands of a second type, e.g., reads, to allow the existing writes to make progress toward completion when the arbiter returns to picking writes.

The present disclosure also addresses the prompt servicing of high- and urgent-priority read requests that occur in CPU and GPU workloads and that affect data processing system performance and user experience. For example, CPU and GPU display traffic needs to be serviced with low latency to maintain real-time performance and avoid screen-stutter, but in a way that has only a low impact on memory bus efficiency.

According to one previously known technique helping to ensure that accesses such as high/urgent priority reads are serviced timely, a memory controller continues a burst (or "streak") of page hit requests for a predetermined number of times after at least one non-page-hit burst is present in the command queue. After the predetermined number of page hits have been serviced, the memory controller switches to a non-page-hit cycle, in which high/urgent priority reads will be picked naturally before medium- or low-priority reads.

In order to address the need for low latency accesses while preserving efficiency, the inventors have developed further techniques that will now be described. According to various embodiments, when a high/urgent read request is received during a write burst, arbiter 238 determines how to quickly service this cross-mode high/urgent priority request without causing unnecessary DRAM efficiency loss from abrupt turnaround. The inventors have developed several techniques by which arbiter 238 can detect such high/urgent priority read requests (normally page conflict requests) and do appropriate "pre-work" so that the high/urgent read requests can be serviced quicker, i.e., with lower latency, but with only a small loss in efficiency. High/urgent page hit requests are indicated by an encoded quality-of-service (QOS) field provided by data fabric 125, stored in command queue 220, and visible to arbiter 238.

Arbiter 238 first determines when a high/urgent priority read request in command queue 320 has become "low-cost". As used herein, "low-cost" means the high/urgent priority read can be started soon after the bus turnaround delay, i.e., it will achieve the status of "timingOK" quickly. In one example, low-cost read hits are read accesses to an open memory page whose activation commands have been sent at least $t_{RCD}$ (write-to-read turnaround latency) cycles ago. For example, cross-mode enable logic 604 can send cross-mode precharge and cross-mode ACT commands for the high/urgent priority read conflicts in a write burst. ($t_{RCD}$—write to read turnaround latency) cycles after an ACT is sent, memory controller 200 can do a write-to-read turnaround. After the write-to-read turnaround cycles, turnaround is finished. Once the turnaround is finished, and the ACT has been sent $t_{RCD}$ cycles ago and the $t_{RCD}$ timing parameter has been satisfied, the high/urgent read hit can have its CAS sent immediately after the read burst starts.

According to some embodiments, arbiter 238 performs one or more of several specific "pre-work" activities. Each of these pre-work activities reduces or tends to reduce the latency of the high/urgent priority reads.

First, during a write burst, arbiter 238 masks same-bank page hit writes that were in existence when an incoming high/urgent priority page conflict read is received by command queue 220.

Second, arbiter 238 sends a precharge command during a page hit write streak. The precharge command turns what were previously page conflict reads into cross-mode page miss reads. If the precharge command is a precharge command for an active row in the same bank as a page hit write of the streak, then it can be implemented as a write with auto-precharge for the page hit write.

Third, arbiter 238 masks same-bank page miss writes that were in existence when an incoming high/urgent priority page miss read is received, so that such writes don't compete with the high/urgent priority reads and don't possibly open other pages to service the same-bank page miss writes. The reads could be just incoming page miss reads or page miss reads converted from the page conflict state using the second pre-work activity mentioned above.

Fourth, during the write burst, cross-mode enable logic and DLAW logic 604 sends cross-mode ACT commands for the high/urgent priority page miss read or reads.

Note that write-to-read turnaround timing may change upon previously disclosed page hits burst. As long as a low-cost incoming high/urgent priority page hit reads is present, arbiter 238 does the turnaround even if there are low-cost page hit writes that haven't been included in the burst. Thus, arbiter 238 provides a more aggressive write-to-read turnaround while leaving some write performance on the table.

In this manner, the unavoidable state transition latency of an incoming high/urgent priority read page conflict access (or page miss access in another example) to a low-cost read hit can be hidden (or partially hidden) inside the write burst, such that this part of processing doesn't cause a write efficiency hit. Thus, this technique is more efficient than performing an abrupt switch to a high/urgent priority read request.

Once memory controller 200 has a low-cost high/urgent priority read, it will turn around the bus to the read cycle and thus reduce latency for the high/urgent priority read. This technique causes some loss of DRAM write efficiency as a tradeoff. However, because read requests waiting for the write burst to end is a major contributor to read latency, it also provides a good opportunity to save read latency.

The early page hit write burst techniques disclosed herein focus on reducing the latency of elevated, e.g., high/urgent priority, reads. Known techniques, on the other hand, focus on preserving efficiency of workloads without respect to the presence of high/urgent priority reads. For example, one specific technique discussed above focuses on preserving the efficiency of write bursts before turning the bus around to read bursts without accounting for the latency of elevated priority reads. The present disclosure only affects efficiency when it is needed, i.e., in the presence of elevated priority reads, and doesn't impact the efficiency of workloads that do not produce high/urgent reads.

Memory controller 200 of FIG. 2 or any portions thereof, such as command queue 220 and arbiter 238, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the embodiment described detecting read cycles to the same bank while pending write cycles were pending in the command decoder. In this case, the DLAW picking mechanism elevates the priority of the writes in order to reduce the latency of the reads. However, in other systems in which write latency is important, the types could be reversed. Moreover, there are a variety of ways to indicate age, including the physical position of the commands in the command queue, a field in the command queue entry, and the like. The command queue can include opposite type information in the entries of the command queue, or a conventional command queue and a standalone page table. Also, techniques for adjusting the priority and/or age may vary in different embodiments.

Accordingly, it is intended by the appended claims to cover all modifications of the disclosed embodiments that fall within the scope of the disclosed embodiments.

What is claimed is:

1. A memory controller, comprising:
a command queue for receiving and storing decoded memory commands and information related thereto including information indicating a type, a priority, an age, and a region of a memory system for a corresponding decoded memory command; and
an arbiter coupled to said command queue for picking selected decoded memory commands among said decoded memory commands from said command queue for dispatch to said memory system by comparing said priority and said age for decoded memory commands having a first type,
wherein said arbiter is operable to:
detect when said command queue receives an elevated priority read command during a streak of page-hit write accesses, wherein said elevated priority read command is one of a page-miss and a page conflict; and
perform at least one pre-work action as an action that reduces a latency of said elevated priority read command when said arbiter subsequently switches from picking page-hit write accesses to picking said elevated priority read command.

2. The memory controller of claim 1, wherein said at least one pre-work action comprises:
elevating at least one of said priority and said age of the elevated priority read command already stored in said command queue.

3. The memory controller of claim 1, wherein said elevated priority read command has a quality-of-service field, and said quality-of-service field has a first encoding that indicates that said elevated priority read command is an urgent read command, and a second encoding that indicates that said elevated priority read command has a high priority.

4. The memory controller of claim 1, wherein said command queue comprises a plurality of entries and stores each entry in age order, and if said arbiter picks an entry out of order leaving a hole in said entries, said command queue shifts younger entries to fill said hole.

5. The memory controller of claim 4, wherein each entry of said command queue comprises a priority sub-field and an age sub-field of a request field for said corresponding decoded memory command of said first type, and a valid sub-field, a priority sub-field, and an age sub-field of an opposite type field for said corresponding decoded memory command of a second type, wherein said valid sub-field of said opposite type field indicates whether said command queue stores at least one valid request of said second type that accesses a first memory region.

6. The memory controller of claim 5, wherein:
if for a first entry, said command queue stores only one command of said second type that accesses said first memory region, said arbiter causes said command queue to store a priority and an age of said only one command of said second type in said priority sub-field and said age sub-field, respectively, of said opposite type field of said first entry; and
if for said first entry, said command queue stores multiple commands of the second type that accesses said first memory region, said arbiter causes said command queue to store a priority and an age of a highest priority one of said multiple commands of the second type in said priority sub-field and said age sub-field, respectively, of said opposite type field of said first entry.

7. The memory controller of claim 1, wherein:
if for a first decoded memory command said command queue stores no decoded memory commands of a second type that accesses a first memory region, said arbiter uses said priority and said age of said corresponding decoded memory command to arbitrate among other decoded memory commands in said command queue; and
if for said first decoded memory command said command queue stores at least one decoded memory command of the second type that accesses said first memory region, said arbiter calculates a new priority based on at least one of said priority of said corresponding decoded memory command and said priority of said at least one decoded memory command of the second type that accesses the first memory region, and a new age based on at least one of said age of said corresponding decoded memory command and said age of said at least one decoded memory command of the second type that accesses the first memory region, and uses said new priority and said new age to arbitrate among said other decoded memory commands in said command queue.

8. The memory controller of claim 7, wherein said arbiter arbitrates among a pair of commands of said first type by picking a command with a higher new priority, and if each command of said pair of commands has the same new priority, said arbiter picks a command with an older new age.

9. A data processing system, comprising:
a memory accessing agent for providing memory access requests;
a memory system; and
a memory controller, comprising:
    a command queue for receiving and storing decoded memory commands and information related thereto including information indicating a type, a priority, an age, and a region of said memory system for a corresponding decoded memory command; and
    an arbiter coupled to said command queue for picking selected decoded memory commands among said decoded memory commands from said command queue for dispatch to said memory system by comparing said priority and said age for decoded memory commands having a first type,
    wherein said arbiter is operable to:
        detect when said command queue receives an elevated priority read command during a streak of page-hit write accesses, wherein said elevated priority read command is one of a page-miss and a page conflict; and
        perform at least one pre-work action as an action that reduces a latency of said elevated priority read command when said arbiter subsequently switches from picking page-hit write accesses to picking said elevated priority read command.

10. The data processing system of claim 9, wherein said at least one pre-work action comprises:
elevating at least one of said priority and said age of the elevated priority read command already stored in said command queue.

11. The data processing system of claim 9, wherein said command queue comprises a plurality of entries and stores each entry in age order, and if said arbiter picks an entry out of order leaving a hole in said entries, said command queue shifts younger entries to fill said hole, wherein each entry of said command queue comprises a priority sub-field and an age sub-field of a request field for said corresponding decoded memory command of said first type, and a valid sub-field, a priority sub-field, and an age sub-field of an opposite type field for said corresponding decoded memory command of a second type, wherein said valid sub-field of said opposite type field indicates whether said command queue stores at least one valid request of said type that accesses a first memory region.

12. The data processing system of claim 11, wherein:
if for a first entry, said command queue stores only one command of said second type that accesses said first memory region, said arbiter causes said command queue to store a priority and an age of said only one command of said second type in said priority sub-field and said age sub-field, respectively, of said opposite type field of said first entry; and
if for said first entry, said command queue stores multiple commands of the second type that accesses said first memory region, said arbiter causes said command queue to store a priority and an age of a highest priority one of said multiple commands of the second type in said priority sub-field and said age sub-field, respectively, of said opposite type field of said first entry.

13. The data processing system of claim 9, wherein:
if for a first decoded memory command said command queue stores no decoded memory commands of the opposite type that accesses a first memory region, said arbiter uses said priority and said age of said corresponding decoded memory command to arbitrate among other commands in said command queue; and
if for said first decoded memory command said command queue stores at least one decoded memory command of the opposite type that accesses said first memory region, said arbiter calculates a new priority based on at least one of said priority of said corresponding decoded memory command and said priority of said at least one decoded memory command of the opposite type that accesses the first memory region, and a new age based on at least one of said age of said corresponding decoded memory command and said age of said at least one decoded memory command of the opposite type that accesses the first memory region, and uses said new priority and said new age to arbitrate among other decoded memory commands in said command queue.

14. The data processing system of claim 13, wherein said arbiter arbitrates among a pair of commands of said first type by picking a command with a higher new priority, and if each command of said pair of commands has the same new priority, said arbiter picks a command with an older new age.

15. A method, comprising:
receiving a plurality of decoded memory commands for a memory system;
storing said plurality of decoded memory commands in a command queue in response to said receiving;
arbitrating among said decoded memory commands in said command queue to pick a selected decoded memory command among said decoded memory commands based on a priority and an age of said decoded memory commands;
detecting when said command queue receives a decoded memory command of a second type to a first memory region of said memory system; and
in response to detecting a presence of said decoded memory command of said second type that accesses said first memory region of said memory system:
    performing a streak of page-hit write accesses;
    detecting when said command queue receives an elevated priority read command during said streak of page-hit write accesses, wherein said elevated priority read command is one of a page-miss and a page conflict; and performing at least one pre-work action as an action that reduces a latency of said elevated priority read command when subsequently switching from picking page-hit write accesses to picking said elevated priority read command.

16. The method of claim 15, wherein said performing said at least one pre-work action that reduces said latency of said elevated priority read command comprises:

elevating at least one of a priority and an age of the elevated priority read command already stored in said command queue.

17. The method of claim 16, wherein said elevating said at least one of said priority and said age of said elevated priority read command comprises:

calculating a new priority based on at least one of said priority of a corresponding decoded memory command of said a first type and said priority of said elevated priority read command; and calculating a new age based on at least one of said age of said corresponding decoded memory command of said first type and said age of said elevated priority read command; and arbitrating among other decoded memory commands in said command queue using said new priority and said new age.

\* \* \* \* \*